(12) United States Patent
Lin et al.

(10) Patent No.: US 7,938,611 B2
(45) Date of Patent: May 10, 2011

(54) FEEDING APPARATUS OF TEST EQUIPMENT

(75) Inventors: Yuan-Chi Lin, Hsin-Chu (TW); Chih-Hung Hsieh, Hsin-Chu (TW)

(73) Assignee: King Yuan Electronics Co., Ltd., Hsin-Chu (TW)

( * ) Notice: Subject to any disclaimer, the term of this patent is extended or adjusted under 35 U.S.C. 154(b) by 1244 days.

(21) Appl. No.: 11/280,279

(22) Filed: Nov. 17, 2005

(65) Prior Publication Data

US 2007/0081885 A1 Apr. 12, 2007

(30) Foreign Application Priority Data

Oct. 7, 2005 (TW) .............................. 94135156 A

(51) Int. Cl.
*B65B 69/00* (2006.01)
(52) U.S. Cl. ...................................................... 414/403
(58) Field of Classification Search .................. 414/403, 414/795.4, 776, 783; 221/92, 123; 70/198, 70/266; 74/21, 89, 25; 193/25 FT
See application file for complete search history.

(56) References Cited

U.S. PATENT DOCUMENTS

| | | | | |
|---|---|---|---|---|
| 3,480,159 A * | 11/1969 | White et al. | ..................... | 414/15 |
| 3,701,021 A * | 10/1972 | Isaac et al. | ..................... | 324/754 |
| 4,691,831 A * | 9/1987 | Suzuki et al. | ................. | 209/573 |
| 4,760,924 A * | 8/1988 | Sato et al. | ..................... | 209/573 |
| 4,910,859 A * | 3/1990 | Holcomb | ..................... | 29/564.2 |
| 5,261,775 A * | 11/1993 | Kobayashi | ..................... | 414/403 |
| 5,733,093 A * | 3/1998 | Palm et al. | ............... | 414/416.04 |
| 5,755,548 A * | 5/1998 | Gaasch et al. | ................. | 414/415 |
| 6,126,376 A * | 10/2000 | Peterson | ..................... | 414/403 |
| 6,944,944 B1 * | 9/2005 | Craythorn et al. | ............... | 29/798 |
| 2002/0067980 A1 * | 6/2002 | Havich et al. | ................. | 414/403 |
| 2002/0141853 A1 * | 10/2002 | Saito | ............................. | 414/403 |
| 2007/0135309 A1 * | 6/2007 | Swab | ............................ | 505/212 |

FOREIGN PATENT DOCUMENTS

JP 2007099506 A * 4/2007

* cited by examiner

*Primary Examiner* — Saúl J Rodríguez
*Assistant Examiner* — Joshua I Rudawitz
(74) *Attorney, Agent, or Firm* — Muncy, Geissler, Olds & Lowe, PLLC

(57) ABSTRACT

In the present invention, a feeding apparatus comprising a plurality of feeding mechanisms is provided. The feeding apparatus comprises a power source, a base, a rotating axle, a plurality of feeding mechanisms, a plurality of connecting units and a plurality of fixing units. The power source is driven to rotate the rotating axle, and then the feeding mechanisms are rotated by the rotating axle to proceed feeding process. In addition, the rotation of each of the feeding mechanisms is controlled by the connecting units and the fixing units. However, the feeding mechanisms can be rotated together or individually to proceed feeding process. Therefore, the production capacity is increased by the feeding apparatus, as well as the cost is reduced by decreasing power needed.

10 Claims, 3 Drawing Sheets

FEEDING APPARATUS OF TEST EQUIPMENT

BACKGROUND OF THE INVENTION

1. Field of the Invention

The present invention relates to a feeding apparatus, and more particularly, relates to a feeding apparatus used in an IC test equipment, combining with tubes to proceed feeding process.

2. Description of the Prior Art

In semiconductor manufacturing process, ICs are usually tested after packaging, so as to control quality strictly. Generally, the unqualified ICs, especially for the damaged ICs in packaging procedure, are needed to be rejected after the ICs are tested. The packaged ICs are protected and carried by a tube to deliver to a testing factory or a test equipment to proceed testing process. During testing, the tube is put in the feeding mechanism of the testing equipment, and the ICs from the tube are delivered to the testing equipment.

FIG. 1 shows a side view of a conventional IC testing equipment 100. A feeding mechanism 104 is disposed on one side of the IC testing equipment 100, and a tube 102 is inserted into the feeding mechanism 104 for providing testing ICs (with reference numeral 103 afterwards, not shown in FIG. 1). An inclined temporarily waiting area 106 is located behind the feeding mechanism 104 for reserving the testing ICs temporarily so as to sort out the testing ICs subsequently. A sorting mechanism 108 is located on the temporarily waiting area 106 to sort out the testing ICs on the temporarily waiting area 106. A testing area 110 is provided for testing the testing ICs, and the tested ICs are collected by a collecting unit 112 subsequently.

FIG. 2A shows an enlarged view of the feeding mechanism 104. The tube 102 is inserted into the feeding mechanism 104. While a rotating unit 104a located by side of the feeding mechanism 104 is rotated by driving with an internal power source, the tube 102 is driven by the rotating unit 104a to rotate to a predetermined position and erected. Therefore, the testing ICs 103 in the tube 102 are glided down to the temporarily waiting area 106 by gravity. The testing ICs 103 are tested after sorting out. With reduction of the ICs size and demand of production capacity, current testing equipment can test several ICs at one time, not just one IC. Consequently, a single feeding mechanism is inefficient and time-wasting as a result of the testing equipment can test 4, 8, 16, and even 32, 64 or more ICs at one time.

Accordingly, the testing equipment is usually integrated with several feeding mechanisms. As shown in FIG. 2B, two feeding mechanisms 104 are series connected with the testing equipment, and their two inlets 104b are provided for the insertion of tubes. Each of rotating units 104a is located by one side of the feeding mechanisms 104 to control the tube inserted into the inlet 104b to rotate to a predetermined position and erect, thus the testing ICs 103 are delivered into the testing equipment and tested.

The above-mentioned feeding mechanisms are series connected for feeding ICs, however, each of the feeding mechanisms needs a rotating unit, and that takes space as well as makes those feeding mechanisms not able to be series connected with each other compactly. Therefore, the more feeding mechanisms that are series connected, the more space is taken. As a result, the testing equipment only combined with two feeding mechanisms which take less space is used in the testing factory, hence the production capacity is not able to increase. Furthermore, a plurality of power sources are needed to provide each of the rotating units of the feeding mechanisms to feed ICs, thus the cost is increased. Accordingly, a feeding apparatus which doesn't take too much space as well as feeds a plurality of testing devices fast at one time is required.

SUMMARY OF THE INVENTION

Accordingly, one object of the present invention is to provide a feeding apparatus, which has a plurality of feeding mechanisms allowed for insertion of a plurality of tubes, feeding a plurality of testing devices to be tested at one time, thus the feeding speed is raised to increase production capacity.

It is another object of the present invention to provide a feeding apparatus with small volume that doesn't take much space. The feeding apparatus takes place of the conventional one with rotating units having large volume and taking space, thus the volume of the feeding apparatus is reduced as well as the space is saved.

It is a further object of the present invention to provide a feeding apparatus having a single power source. The feeding apparatus, which needs only one power source to proceed rotating the feeding mechanisms and erecting tubes to feed, takes place of the conventional ones having a plurality of power sources, thus the cost needed for the feeding apparatus is reduced.

According to the objects mentioned above, the present invention provides a feeding apparatus having a plurality of feeding mechanisms. The feeding apparatus comprises a power source, a base, a rotating axle, a plurality of feeding mechanisms, a plurality of connecting units, and a plurality of fixing units. The rotating axle is disposed above the base and connected with the power source. In addition, the rotating axle is passed through one side of each feeding mechanism, thus the plurality of the feeding mechanisms are series connected. Moreover, each of the connecting units is disposed on the side approaching to the rotating axle. An inlet is located correspondingly to the other side of each of the feeding mechanisms. During feeding, the connecting units of the feeding mechanisms to be rotated are connected with the feeding mechanisms and the rotating axle, and the fixing units release the feeding mechanisms to separate from the feeding mechanisms. The rotating axle is rotated by driving the power source, and the feeding mechanisms are further driven by the rotating axle to rotate to a predetermined position, thereby the tubes are erected to make the testing devices glide into the testing equipment to be tested by gravity.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 3A:
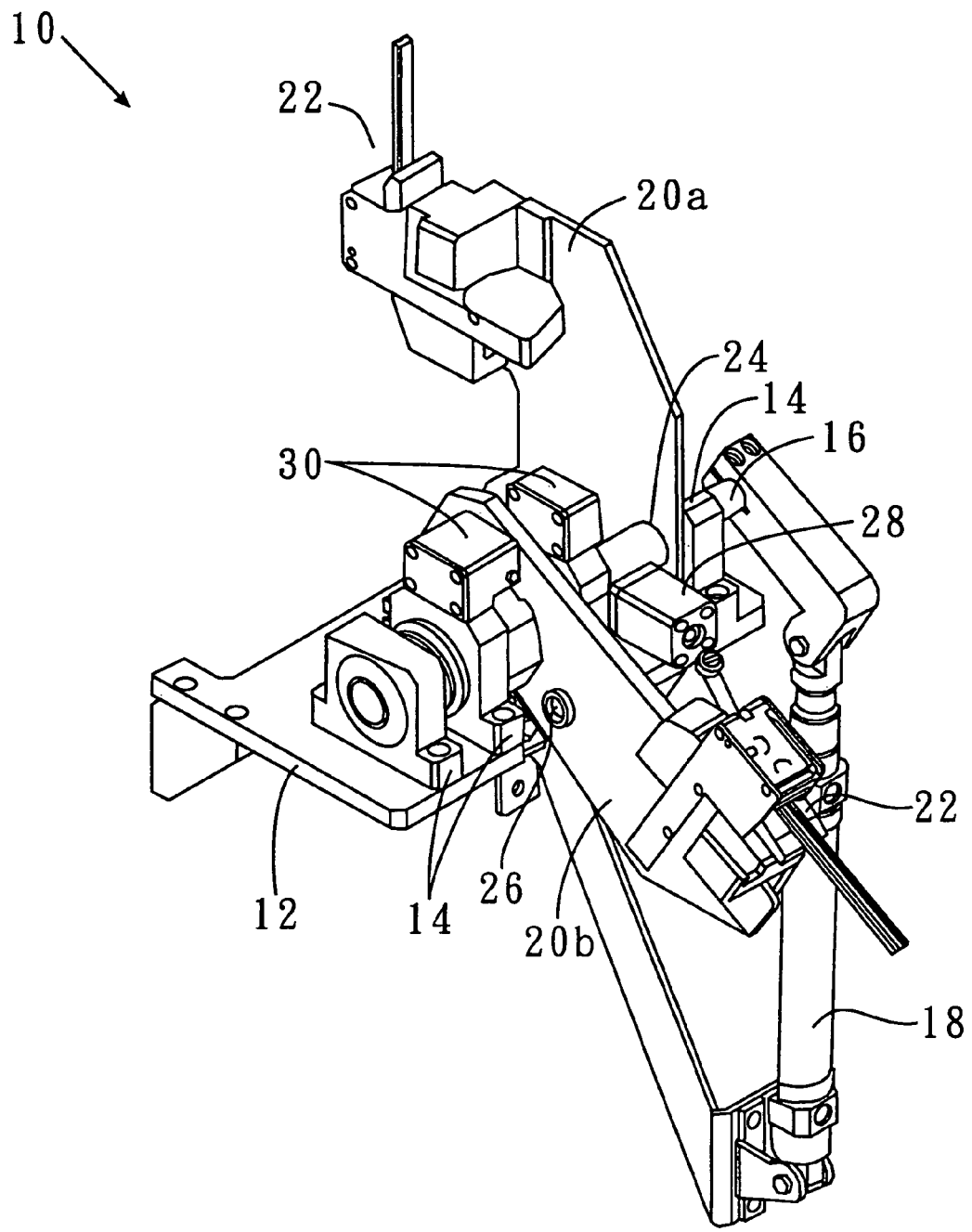
FIG. 3A to 3C are schematic representations of a feeding apparatus, a connecting unit thereof, and a fixing unit thereof according to the present invention individually.

FIG. 3A is a three-dimensional schematic diagram of a feeding apparatus 10 having a plurality of feeding mechanisms according to one preferred embodiment of the present invention. The feeding apparatus 10 comprises a base 12, a plurality of supporting units 14 located on the base 12 to support a rotating axle 16 thereon and to be rotated. The power source 18 is connected with a rotating axle 16 to control the rotation of the rotating axle 16. Two feeding mechanisms 20a and 20b are shown in the embodiment, an inlet 22 is disposed on one side of each of the feeding mechanism 20a and 20b, and an opening 24 is disposed in the other side of each of the feeding mechanism 20a and 20b. The opening 24 is passed through by the rotating axle 24, thus the two feeding mechanisms 20a and 20b are series connected. In addition, a connecting unit 28 is disposed on the side approaching to the opening 24 of each of the feeding mechanisms 20a and 20b to control the feeding mechanisms 20a and 20b to be connected with the rotating axle 16 or not, and a fixing structure 26 is disposed in each of the feeding mechanisms 20a and 20b. In addition, a fixing unit 30 is disposed by the side of each of the feeding mechanisms 20a and 20b to combine with the fixing structure 26 to fix the feeding mechanisms 20a and 20b in the initial position, and not to be rotated by the rotating axle 16.

Figure 3B:
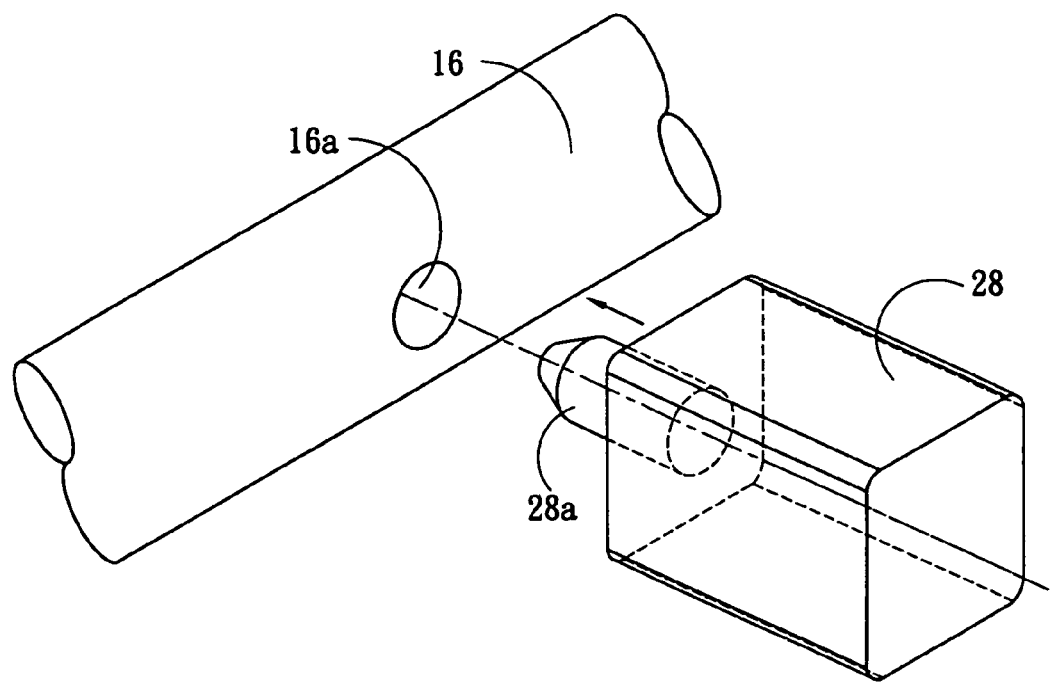
Figure 3C:
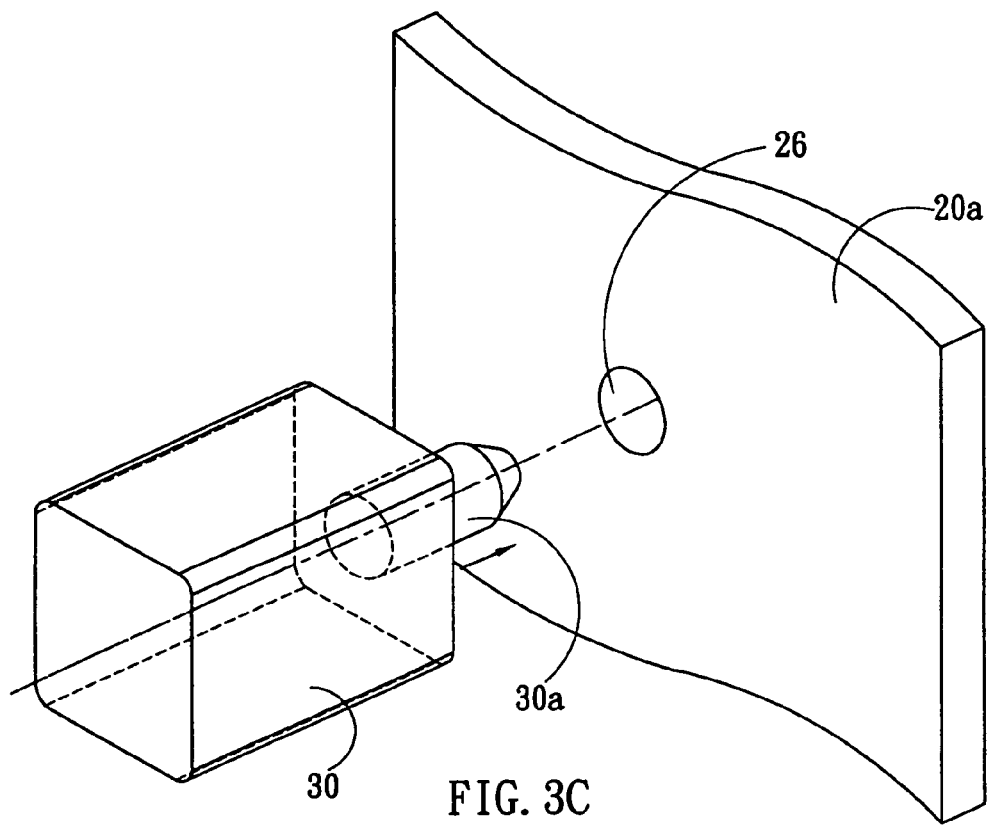

FIG. 3B shows an enlarged schematic diagram of the connecting unit 28 and the rotating axle 16 according to the embodiment of the present invention. Every connecting unit 28 has a connecting bolt 28a, and a hole 16a located in the position corresponding to the connecting bolt 28a in the rotating axle 16 is provided for the insertion of the connecting bolt 28a, thus the feeding mechanisms 20a and 20b are combined with the rotating axle 16. FIG. 3C shows an enlarged schematic diagram of the fixing structure 26 and the fixing unit 30 according to the embodiment of the present invention. The fixing structure 26 is a fixing hole, and the fixing unit 30 has a corresponding fixing bolt 30a for inserting into the fixing structure 26, thus the feeding mechanisms 20a and 20b are fixed in the initial position, not rotated with the rotating axle 16. In the embodiment, the power source 18 is an air cylinder, and the connecting unit 28 and the fixing unit 30 are a connecting air cylinder and a fixing air cylinder respectively.

The feeding apparatus 10 according to the embodiment of the present invention comprises but not limited to two feeding mechanisms, the number of the feeding mechanisms can be optionally changed according to needs. Compared with conventional feeding apparatuses, the feeding apparatus of the present invention doesn't need a rotating unit having a large volume and taking a lot of space. Since each of the feeding mechanisms 20a and 20b according to the present invention has one connecting unit 28 and one corresponding fixing unit 30 thereto, thus each of the feeding mechanisms can proceed rotating and feeding individually.

As shown in the embodiment of FIG. 3A, the feeding mechanisms 20a and 20b respectively illustrate that one feeding mechanism 20a is not rotated and is kept at the initial position, and the other 20b is rotated to a predetermined position. First, a tube is inserted into the inlet 22 of the feeding mechanism 20b, and the connecting unit 28 (i.e. the connecting air cylinder) is driven to push the connecting bolt 28a into the connecting hole 16a of the rotating axle 16, such that the feeding mechanism 20b and the rotating axle 16 can be combined with each other. The corresponding fixing unit 30 (i.e. the fixing air cylinder) of the feeding mechanism 20b is then driven to retract the fixing bolt 30a that is inserted into the fixing structure 26 (i.e. the fixing hole) of the feeding mechanism 20b, thus the fixing unit 30 is separated from the feeding mechanism 20b. Next, the rotating axle 16 is rotated while the power source 18 is on, such that the feeding mechanism 20b is rotated by the connecting unit 28. While the feeding mechanism 20b is rotated to the predetermined position to erect the tube, the testing devices in the tube are glided to the testing equipment by gravity and tested. After feeding, the feeding mechanism 20b is rotated by the rotating axle 16 driven by the power source 18 back to the initial position, and the fixing bolt 30a of the fixing unit 30 is inserted again into the fixing structure 26 of the feeding mechanism 20b, then the connecting bolt 28a inserted into the connecting hole 16a is retracted into the connecting unit 28.

As for the feeding mechanism 20a that is not rotated, the corresponding fixing bolt 30a of the fixing unit 30 is inserted into the fixing structure 26 (i.e. the fixing hole) of the feeding mechanism 20a, such that the feeding mechanism 20a is fixed in the initial position and not rotated. Meanwhile, the connecting unit 28 of the feeding mechanism 20a stands, such that the feeding mechanism 20a is separated from the rotating axle 16.

Figure 1:
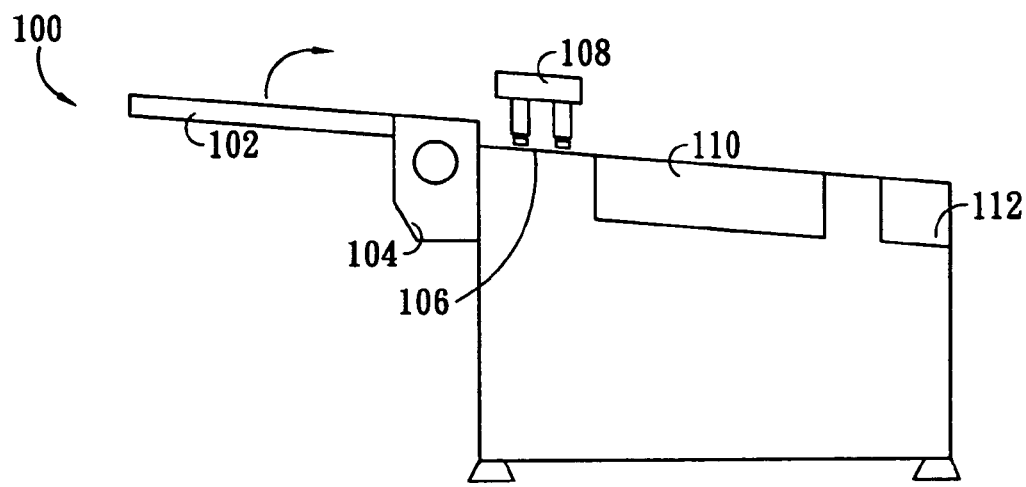
FIG. 1 shows a side view of a conventional IC testing equipment.
Figure 2A:
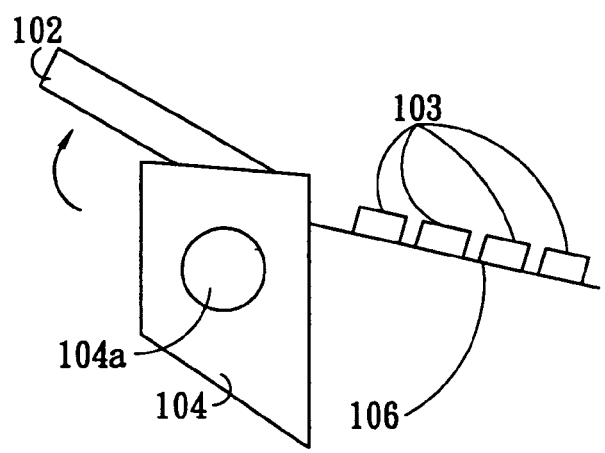
FIG. 2A and 2B individually show a side view and a vertical view schematic diagrams of a conventional feeding mechanism.
Figure 2B:
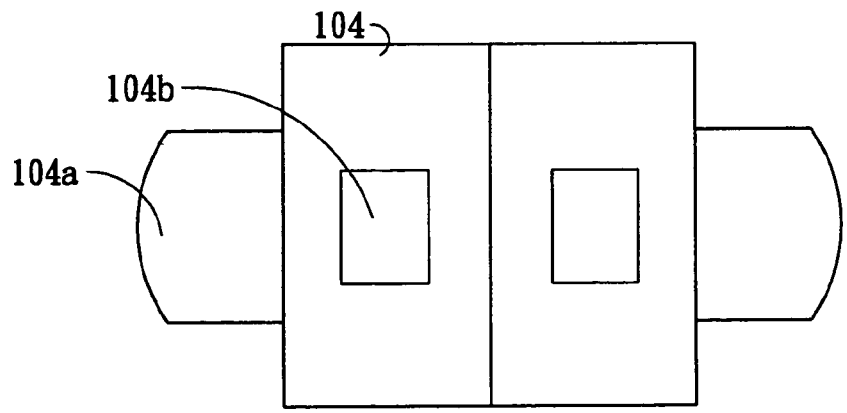

According to the embodiment mentioned above, the feeding apparatus 10 of the present invention is employed to replace the feeding mechanism 104 of the IC test equipment 100 shown in FIG. 1 and FIG. 2B. The feeding apparatus 10 of this invention has a plurality of feeding mechanisms 20a/20b, which can proceed with the feeding process simultaneously or individually for the testing needs. In addition, since the conventional rotating units having large volume and space are not needed for the feeding apparatus 10 of this invention; thus more space is provided for more feeding mechanisms. Therefore, the testing production capacity is increased, the volume is reduced, and the space is saved. Moreover, the feeding apparatus 10 of the present invention only needs one power source for the plurality of feeding mechanisms to proceed with the feeding process simultaneously or individually; thus the cost is reduced.

Although specific embodiments have been illustrated and described, it will be obvious to those skilled in the art that various modifications may be made without departing from what is intended to be limited solely by the appended claims.

What is claimed is:

1. A feeding apparatus of a test equipment for feeding integrated circuit (IC) elements to said test equipment, said feeding apparatus comprising:
   a power source;
   a base;
   a rotating axle disposed above said base and connected with said power source being driven by said power source;
   a plurality of feeding mechanisms, each of said feeding mechanisms being inserted with a tube carrying IC elements to be tested, each of said feeding mechanisms comprising an inlet disposed on its first end and an opening disposed on its second end, and said rotating axle connecting each of said feeding mechanisms by passing through the openings;
   wherein each of said feeding mechanisms is controlled by a connecting unit and a fixing unit, said fixing units being disposed above said base, when said connecting unit connects with said feeding mechanism, said feeding mechanism is rotated and driven by said rotating axle to a predetermined position so that the IC elements carried by said tube can be slid into said test equipment by gravity force, when said fixing unit fixes said feeding mechanism in an initial position, said feeding mechanism is not rotated and driven by said rotating axle.

2. The feeding apparatus according to claim 1, further comprising a plurality of supporting units disposed on a surface of said base for supporting said rotating axle.

3. The feeding apparatus according to claim 1, wherein said power source is an air cylinder.

4. The feeding apparatus according to claim 1, wherein said connecting unit is a connecting air cylinder.

5. The feeding apparatus according to claim 4, wherein said connecting air cylinder has a connecting bolt.

6. The feeding apparatus according to claim 5, wherein said connecting bolt has a corresponding connecting hole disposed in said rotating axle for inserting said connecting bolt to combine said feeding mechanism with said rotating axle.

7. The feeding apparatus according to claim 1, wherein each of said plurality of feeding mechanisms further comprises a fixing structure for connecting with said fixing unit in said initial position.

8. The feeding apparatus according to claim 7, wherein said fixing structure is a fixing hole.

9. The feeding apparatus according to claim 7, wherein said fixing unit is a fixing air cylinder.

10. The feeding apparatus according to claim 9, wherein said fixing air cylinder has a fixing bolt for inserting into said fixing structure to fix said plurality of feeding mechanisms individually.

* * * * *